United States Patent [19]

Pavlidis et al.

[11] Patent Number: 4,721,985
[45] Date of Patent: Jan. 26, 1988

[54] VARIABLE CAPACITANCE ELEMENT CONTROLLABLE BY A D.C. VOLTAGE

[75] Inventors: Dimitrios Pavlidis, Paris; Erhard Kohn, Orsay; Ernesto Perea, Paris; John Magarshack, Rueil Malmaison, all of France

[73] Assignee: Thomson-CSF, Paris, France

[21] Appl. No.: 750,478

[22] Filed: Jul. 1, 1985

[30] Foreign Application Priority Data

Jul. 3, 1984 [FR] France .............................. 84 10521

[51] Int. Cl.[4] ..................... H01L 29/40; H01L 29/48; H01L 29/20
[52] U.S. Cl. ........................... 357/15; 357/14; 357/51; 357/68; 333/172; 333/204; 333/205; 334/15
[58] Field of Search ............... 357/14, 51, 15, 68; 333/172, 204, 205

[56] References Cited

U.S. PATENT DOCUMENTS

| | | | |
|---|---|---|---|
| 3,210,696 | 10/1965 | Philips et al. | 357/14 |
| 3,258,723 | 6/1966 | Osafune et al. | 357/14 |
| 3,535,600 | 10/1968 | Engeler | 357/14 |
| 3,657,609 | 4/1972 | Oswald et al. | 357/14 |
| 3,675,161 | 7/1972 | Teramoto et al. | 357/14 |
| 3,761,823 | 9/1973 | Harris | 334/15 |
| 3,805,198 | 4/1974 | Gewartowski et al. | 333/204 |
| 3,825,858 | 7/1974 | Amemiya et al. | 334/15 |
| 4,048,646 | 9/1977 | Ogawa et al. | 357/68 |
| 4,399,417 | 8/1983 | Ballantyne et al. | 357/14 |
| 4,438,445 | 3/1984 | Colquhoun et al. | 357/15 |
| 4,456,917 | 6/1984 | Sato et al. | 357/15 |
| 4,481,487 | 11/1984 | Brehm et al. | 357/14 |
| 4,642,580 | 2/1987 | Scott | 357/22 H |

FOREIGN PATENT DOCUMENTS

2829212 1/1980 Fed. Rep. of Germany.
2021035 7/1970 France.

OTHER PUBLICATIONS

Electronics Letters, vol. 16, No. 9, Apr. 1980, pp. 317–319, Hitchin Herts, GB; J. J. Harris et al.

Primary Examiner—Andrew J. James
Assistant Examiner—Jerome Jackson, Jr.
Attorney, Agent, or Firm—Oblon, Fisher, Spivak, McClelland & Maier

[57] ABSTRACT

The invention relates to a variable capacitance element operating in the ultra-high frequency range. In order to integrate this element on to an integrated circuit chip, the element is designed so that the control voltage does not interfere with the ultra-high frequency signal and has neither filters nor shock chokes which are not integrable. The element according to the invention utilizes the junction capacitances variation of at least one diode, reverse-biased by a voltage across a resistor, the high frequency signal being at the diode anode. The element construction comprises an active zone in a semiinsulating substrate. Two metallizations partly cover the active zone and form therewith at least one diode. A projection to the active zone forms the resistor, to which is applied the control voltage. The diodes are p-n junctions of schottky diodes. The semiconductor material is Si or from the III-V group. Application to oscillators, filters, phase shifters, etc. in ultra-high frequency equipment.

11 Claims, 14 Drawing Figures

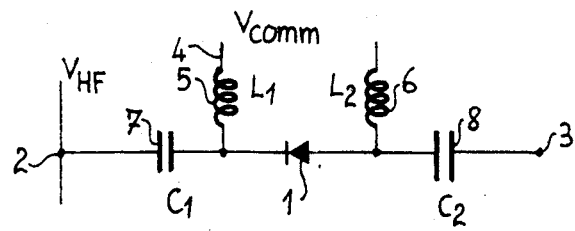
FIG_1 PRIOR ART
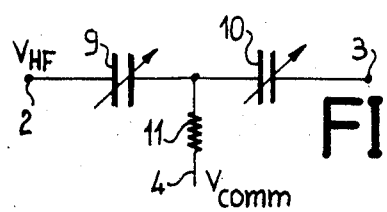
FIG_2
FIG_3
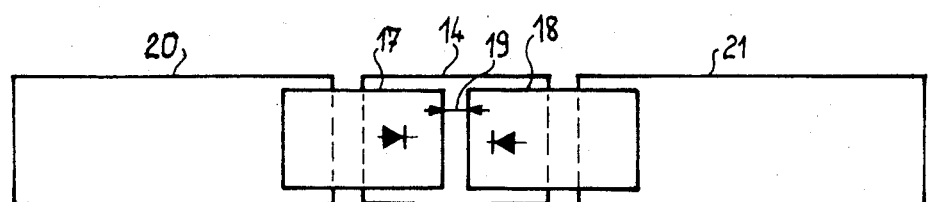
FIG_4
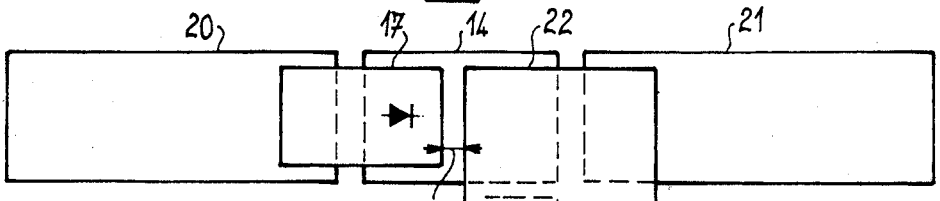
FIG_7

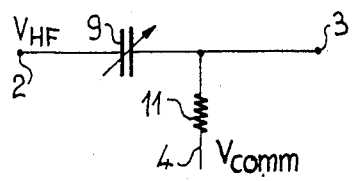
FIG_5
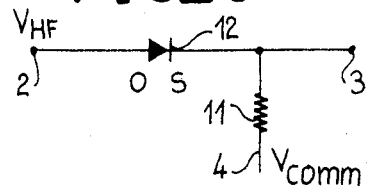
FIG_6
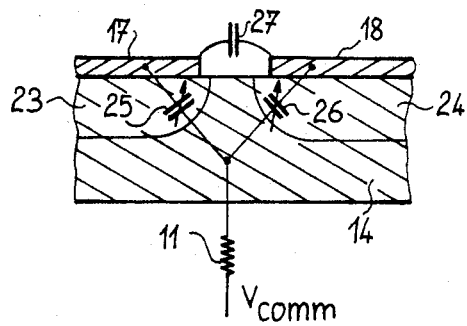
FIG_8
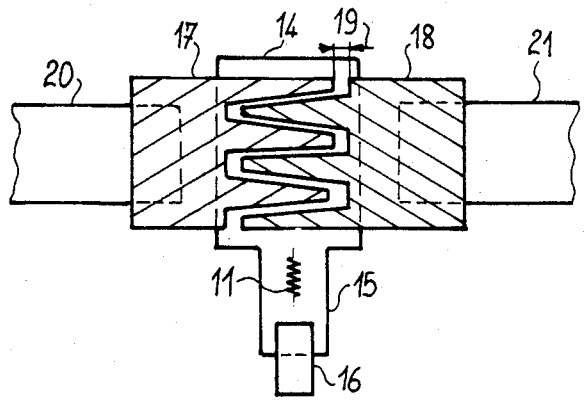
FIG_9
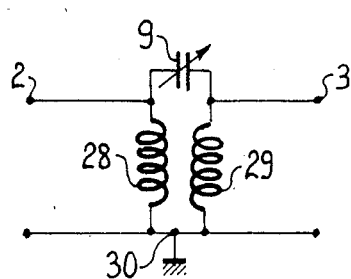
FIG_10

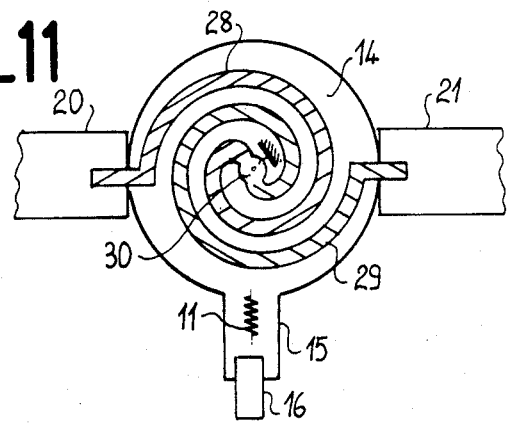
FIG_11
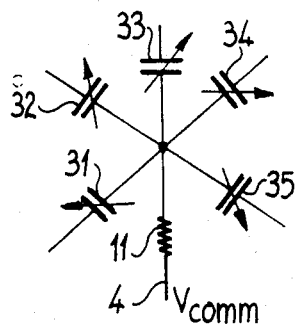
FIG_12
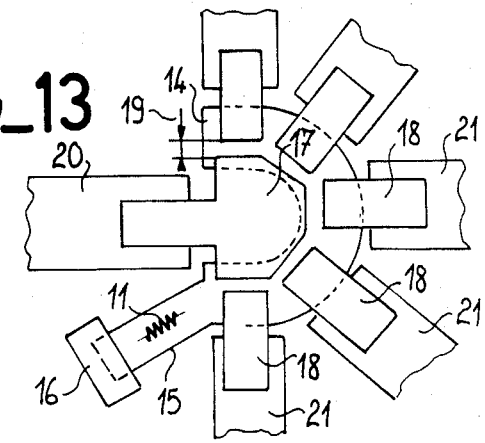
FIG_13
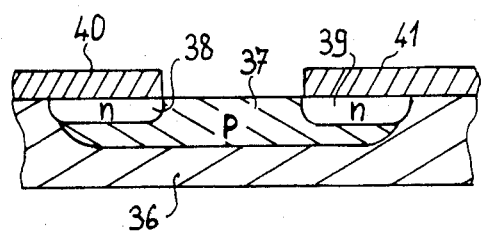
FIG_14

VARIABLE CAPACITANCE ELEMENT CONTROLLABLE BY A D.C. VOLTAGE

BACKGROUND OF THE INVENTION

The present invention relates to a voltage-controllable, variable capacitance element, more particularly intended for integration on to an integrated circuit pellet. This controllable capacitance element makes it possible to eliminate shock chokes which filter the control voltage relative to the voltage of the signal, as well as the insulating capacitors normally separating a controllable capacitor according to the prior art and the remainder of the circuit. However, in the element according to the invention, the control voltage does not interfere with the signal. The controllable capacitance element according to the invention more particularly relates to the field of ultra-high frequencies.

Hitherto the best known and most widely used variable capacitance, not constituted by a capacitor whose value is mechanically modified, is a reverse biased Schottky diode, known as a varactor. The capacitance of the metallization on the semiconductor material of a Schottky diode varies with the control voltage applied to the diode cathode. This variable capacitor can be used as a tuning element for the oscillator or filter, but the disadvantage of such a variable capacitor is that the d.c. control voltage must be separated from the ultra-high frequency signal by a filter, having at least one and often two shock chokes. The presence of a shock choke on the surface of an integrated chip is to be avoided wherever this is possible, because a choke or filter occupies too much space on the chip and considerably decreases the integration density.

The variable capacitance element according to the invention is based on a well-known, voltage controllable, variable resistance element, namely the field effect transistor. In a non-polarized field effect transistor, the d.c. voltage applied to the gate varies the resistances between the source and the channel and between the channel and the drain, e.g. gripping the channel to a greater or lesser extent by the depletion zone in the case of a depletion field effect transistor. Thus, the control voltage on the gate of a field effect transistor is not directly connected to the signal voltage, so that a shock choke or filter is not necessary on the gate voltage. The control voltage acts by capacitive effect on the channel.

The equivalent circuit diagram of a variable capacitance element according to the invention switches over the resistors and capacitors of the equivalent circuit diagram of a field effect transistor, so that a T-structure diagram is obtained. The two terminals for access to said element are constituted by capacitors, either in the form of Schottky diodes, or junction diodes, the diodes being connected as a common cathode. The control terminal is constituted by a resistor, across which the control voltage is applied. The resistor is connected to the common point between the two diodes. In the case of the variable capacitance element construction according to the invention, the capacitances of the two diodes are pure capacitances, without a parasitic access resistance. According to a preferred embodiment of the invention, the diodes are constituted by a doped active zone in a semiinsulating substrate. Two Schottky metallizations are juxtaposed on said active zone, so as to form Schottky junctions. These two metallizations are in electrical contact with two microstrips forming the access terminals to the element. The doped zone also has a strip-like projection, on which there is an ohmic contact. The dimensions and doping level of said projection regulate the value of its resistance. The control voltage is applied to the ohmic contact.

In other embodiments adapted to the requirements, the variable capacitance element only has a single diode, or has more than two diodes, so that an element is obtained which, as from a single control voltage, makes it possible to control or tune a plurality of circuits.

SUMMARY OF THE INVENTION

More specifically, the present invention relates to a variable capacitance element controllable by a d.c. voltage, which does not interfere with an ultra-high frequency voltage modulated by said element. The variable capacitance is formed by the junction of at least one diode which is reverse biased by the control voltage applied across a resistor. The said element comprises, an active zone doped at $10^{17}$ at·cm$^{-3}$, formed in a semiinsulating material substrate, with at least two metallizations partly covering the active zone. At least one metallization forms a diode with the active zone. The metallizations also leave a space between two of their facing edges. The element also including second active zone, doped at $10^{17}$ at·cm$^{-3}$ in ohmic contact with the first active zone, and forming a resistor in contact with an ohmic metallization to which the control voltage is applied. A first microstrip is in contact with a first metallization and a second microstrip is in contact with a second metallization, forming the access terminals to the variable capacitance element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, which show:

FIG. 1 a diagram for filtering the control voltage of a Schottky diode used as a variable capacitor according to the prior art.

FIG. 2 an equivalent circuit diagram of a voltage-controlled variable capacitance element according to the invention.

FIG. 3 a circuit diagram of the variable capacitance element according to the invention.

FIG. 4 an embodiment of the variable capacitance element according to the invention in accordance with FIGS. 2 and 3.

FIG. 5 an equivalent circuit diagram of the variable capacitance element in a first variant of the invention.

FIG. 6 a circuit diagram of the variable capacitance element of FIG. 5.

FIG. 7 an embodiment of the variable capacitance element according to the first variant of FIGS. 5 and 6.

FIG. 8 a sectional view of a semiconductor crystal showing the function of the capacitances in the variable capacitance element according to the invention.

FIG. 9 the arrangement of metallizations for increasing the value of the capacitances in a second variant of the element according to the invention.

FIG. 10 a circuit diagram of a transformer tuned by a variable capacitor according to the invention.

FIG. 11 a diagram of the transformer of FIG. 10.

FIG. 12 an equivalent circuit diagram of a variable capacitance element having a plurality of variable capacitors according to a variant of the invention.

FIG. 13 an embodiment of the variable capacitance element according to FIG. 12.

FIG. 14 a sectional view of a semiconductor crystal in the case where the capacitors are junction capacitors between two regions having opposite doping types.

DETAILED DESCRIPTION OF THE PREFERRED EMBODIMENTS

The invention is essentially intended for integration of an ultra-high frequency circuit on materials such as GaAs or compounds of the III-V group. However, it can be applied to silicon but, in order to simplify the text, it will be described on the basis of examples in which the Schottky diodes are formed on GaAs. The final figure makes it possible to extend the application to silicon.

FIG. 1 shows the filtering diagram of the control voltage of a Schottky diode used as a variable capacitor according to the prior art. If it is necessary to vary the capacitance between the two terminals 2, 3 of a circuit, it is known to connect a reverse biased Schottky diode 1. This type of diode is more generally known under the name varicap or varactor. A control voltage $V_{comm}$ is applied by a connection 4 to the cathode of diode 1. However, if connection 4 was applied without any precaution to the cathode of diode 1, interference would take place between the d.c. control voltage $V_{comm}$ and the signal voltage $V_{HF}$, carried to point 2 of the circuit. Therefore, in order to decouple the d.c. control voltage $V_{comm}$ and the signal voltage $V_{HF}$, it is necessary to filter the d.c. voltage by at least one shock choke L1, designated 5, connected to the cathode of diode 1. Frequently and unless point 3 of the circuit is connected to earth, it is necessary to connect a second shock choke L2, designated 6, to the diode anode, as well as two capacitors C1 and C2 designated 7 and 8. This frequently encountered circuit diagram suffers from two serious disadvantages when it is wished to apply it to an integrated circuit. First, the shock chokes occupy a large surface area on the crystal chip on which the integrated circuit is to be formed. This is detrimental to making the integrated circuit dense. Secondly, the two capacitors C1 and C2 are undesirable in an integrated circuit, because they occupy a large area and are difficult to produce, since their production involves a sequence of operations with metallizations and insulation coatings.

Thus, the object of the invention is to provide a d.c. voltage-controllable, variable capacitance element, i.e. the equivalent of a varicap diode, but such that the shock chokes L1, L2 and the insulating capacitors C1, C2 are no longer required with a view to the integration on an e.g. GaAs integrated circuit.

FIG. 2 shows the equivalent circuit diagram of the voltage-controllable variable capacitance element according to the invention. This diagram has a T-shaped structure, in which two variable capacitors 9, 10 are interposed between points 2 and 3 of an ultra-high frequency circuit, said points having received the same references as in FIG. 1, so as to facilitate comparison. The variable capacitors 9, 10 are controlled by a d.c. control voltage $V_{comm}$, applied to a metal connection 4, which is connected to the common point between the two variable capacitors 9, 10 by means of a resistor 11. The presence of a capacitor 9 between signal $V_{HF}$ and the control voltage $V_{comm}$ ensures that a smoothing choke is not necessary. This diagram, which has a T-shaped structure, is similar to the equivalent circuit diagram of a field effect transistor, in which the two variable capacitors 9, 10 would be replaced by two variable resistors and in which resistor 11 would be replaced by a fixed capacitor.

FIG. 3 shows the electric circuit diagram corresponding to the equivalent circuit diagram of FIG. 2. The variable capacitors in the element according to the invention are produced by means of two diodes 12, 13, which are connected as a common cathode. Control voltage $V_{comm}$ is supplied to the common point of the two cathodes, so that the diodes are reverse biased. When a d.c. voltage is applied across resistor 11 to the cathodes of the two diodes 12, 13, the capacitances thereon vary and the capacitance between points 2 and 3 of the circuit also vary. The presence of diodes opposing the passage of the current from the d.c. control voltage in 4 to the high frequency signal in 2 means that it is not useful to decouple the control voltage.

FIG. 4 shows a first embodiment of a variable capacitance element according to the invention and includes the diagrams of FIGS. 2 and 3.

A doped material recess 14 is formed in an insulating or semiinsulating material substrate, which is not shown in the drawing for clarity reasons but which constitutes the integrated circuit chip substrate. This recess 14 forms what could be called an active zone when compared with the remainder of the insulating or semiinsulating substrate. It is doped by known means, such as epitaxy or ion implantation of type n with a doping level of approximately $10^{17}$ at·cm$^{-3}$, the semiinsulating substrate being slightly or unintentionally doped at a level lower than $10^{-14}$, which means to say that it is semiinsulated. The active zone or recess 14 has a preferably rectangular projection 15, whose dimensions, in conjunction with the doping level, make it possible to determine the value of resistor 11 by which the control voltage $V_{comm}$ is applied. This control voltage comes from a metallization 16 in ohmic contact with projection 15.

Recess 14 and its projection 15 can also have type p doping. The mobility of the holes is less than the mobility of the electron and type p doping leads to a greater resistivity of projection 15, which has the advantage of providing resistor 11 on a smaller surface area, as a result of a smaller projection 15, so that integration is thereby increased.

On active zone 14 are deposited two Schottky metallizations 17, 18 having at least two parallel edges separated from one another by an approximately 5 micron wide slot 19. The junction between Schottky metallizations 17, 18 and the active zone 14 constitutes the two Schottky diodes.

Moreover, the Schottky metallizations 17, 18 are in electrical contact, by partial overlapping, with two microstrips 20, 21, which normally have an impedance of 50 ohm, with a typical width of 73 microns and a substrate thickness of 100 microns The microstrips 20, 21 constitute the access connections to the variable capacitance element according to the invention and correspond to points 2 and 3 of the circuit diagram of FIG. 3.

The microstrips are kept at a zero d.c. voltage. Ohmic contact 16 is positively biased and the two Schottky diodes are consequently reverse biased, which leads to the circuit diagram of FIG. 3.

FIG. 5 shows the equivalent circuit diagram of the variable capacitance element in a first variant of the invention, when one of the two poles of the diagram e.g. pole 3 does not transmit a signal. In this case it is not vital to provide a variable capacitance element with two variable capacitors such as 9 and 10 shown in FIG. 2. A single variable capacitor 9 between the signal voltage $V_{HF}$ and the control voltage $V_{comm}$ is adequate and the variable capacitor 10 between earth and the control voltage can be eliminated.

The FIG. 6 shows the circuit diagram of FIG. 5 and consequently, according to the invention, the variable capacitor 9 is in the form of a single diode 12, whose capacitance is controlled across resistor 11 by control voltage $V_{comm}$.

FIG. 7 is an embodiment of the variable capacitance element according to the first variant of FIGS. 5 and 6. In a semiinsulating or insulating substrate, not shown in FIG. 7, is formed a recess 14, either by epitaxy, or by ion implantation with type n or p doping, as stated in connection with FIG. 4. Alongside the first recess 14 is provided a second recess 15, which corresponds to the implantation of resistor 11 across which is applied the diode control voltage. Recess 15 can in direct contact with recess 14, as shown in FIG. 4, or it can be separated therefrom as shown in FIG. 7.

Over part of the recess 14 is formed a Schottky metallization 17, whilst on another part of recess 14 is formed an ohmic contact 22. In this case it is no longer possible to provide a Schottky contact like contact 18 of FIG. 4, because there would then be two Schottky diodes on recess 14 and for this reason metallization 22 takes an ohmic contact.

Schottky metallization 17 projects from recess 14 and is in contact with a microstrip 20 which is in all points identical with the microstrip 20 described in connection with FIG. 4. The ohmic metallization 22 also projects from the recess 14 and is in electrical contact with a second microstrip 21 and with the implanted recess 15. Thus, there is a direct electrical connection between metallization 16 to which is applied control voltage $V_{comm}$, recess 14 and microstrip 21. A Schottky diode is formed between Schotty metallization 17 and recess 14. The two metallizations 17, 22 have at least two linear sides which are parallel to one another and spaced by a length 19 of approximately 5 microns, which participates in the formation of a capacitor. The difference between FIGS. 7 and 4 is in part that microstrip 20 in the case of FIG. 7 is under a zero d.c. voltage, because it is insulated in the control voltage $V_{comm}$ by the Schottky diode. However, the microstrip 21, joined by an ohmic contact 22 to resistor 11 and to contact 16 to which the control voltage $V_{comm}$ is applied is subject to a variable d.c. voltage, which is that which exists on ohmic metallization 16.

FIG. 8 is a part sectional view of a semiconductor crystal, on which two metallizations are deposited in order to demonstrate the formation of the capacitors.

Two Schottky metallizations 17, 18 are deposited on the recess 14, which has been diffused or implanted into the substrate of the integrated circuit chip. When these metallizations are subject to a control voltage $V_{comm}$, which arrives via resistor 11 electrically connected to recess 14, two depletion zones 23, 24 are formed beneath Schottky metallizations 17, 18 respectively. Between the depletion zones 23, 24 and the remainder of recess 14 are formed two junction capacitors 25, 26 respectively. These are capacitors, whose value varies with the control voltage, i.e. also varies with the depth of the depletion zones 23, 24 having variable capacitances in the variable capacitance element controlled by a voltage according to the invention. Moreover, between the edges of the metallizations 17, 18, which are spaced by approximately 5 microns, is also formed a capacitor 27, which is fixed because the distance between metallizations 17, 18 does not vary as a function of the control voltage. Thus, in FIG. 8 there is once again the T-shaped structure of FIG. 2, according to which two capacitors vary under the effect of the voltage applied to a resistor.

FIG. 8 makes it possible to introduce FIG. 9 which shows the arrangements of the metallizations in order to increase the value of the capacitors, which constitutes a second variant of the invention.

As the capacitors formed by the Schottky metallizations on active layer 14 comprise in part a capacitor 27 formed between the edges of Schottky metallization 17, 18, it is possible to increase the values of capacitors 25, 26 by giving interdigitated shaped or forms to the two metallizations 17, 28. The length of the space 19 separating the metallizations is greater if the metallizations are interdigitated, which increases capacitors 25, 26, 27.

FIG. 10 is the circuit diagram of a transformer tuned by a variable capacitor according to the invention. In certain circuits, it is necessary to use a transformer having a primary winding 28 and a secondary winding 29, said two windings being jointed at a common point e.g. to earth 30. However, it is then necessary to interpose a variable capacitor 9 between the two ends 2, 3 of the transformer in order to tune the double wire transformer as a function of the frequency, the ends 2, 3 of said two windings corresponding to ends 2, 3 of the preceding drawings, particularly FIG. 5, i.e. at least point 2 is exposed to a voltage $V_{HF}$.

The construction of such a transformer is shown in FIG. 11. In an insulating or semiinsulating substrate, as shown in FIG. 11, are formed an active zone 14 and a projection 15, which correspond to control resistor 11. Regions 14 and 15 are type n or p-doped, as stated hereinbefore. Then, by using known metallization operations, on active zone 14 is deposited a double spiral winding comprising a first winding 28, which is connected to a microstrip 20 and a second winding 29 connected to another microstrip 21. The central point of this double spiral is connected to earth 30 either via a metallized duct through the chip substrate, or by a wire. Windings 28, 29 are Schottky contacts. The metallizations 16 by which the control voltage $V_{comm}$ is supplied is an ohmic contact.

FIG. 12 shows the equivalent circuit diagram of a variable capacitance element having a plurality of variable capacitors constituting a third variant of the invention. As in the preceding drawings, such as FIG. 2, the variable capacitance element according to the invention has a T-shaped structure with a maximum of two variable capacitors 9, 10, with a first variant illustrated by FIG. 5 only having a single variable capacitor 9, so that the diagram of the element according to the invention makes it possible to simultaneously control the same number of variable capacitors as technology makes it possible to implant on an integrated circuit chip. Thus, in FIG. 12, five variable calacitors are shown and they are simultaneously controlled by one and the same control voltage $V_{comm}$, but this number does not limit the scope of the invention.

FIG. 13 shows an embodiment of the element having a plurality of variable capacitors, whose equivalent circuit diagram is given in FIG. 12. As in the preceding cases, the element having a plurality of variable capacitors 31 to 35 has, formed in an insulating or semiinsulating substrate 9 shown in FIG. 13, a type n or p-doped active zone 14. The latter has a projection 15 constituting the resistor 11 across which is applied the bias $V_{comm}$ from ohmic metallization 16. A Schottky metallization 17 is partly supported by the active region 14 and is partly in electrical contact with a first microstrip 20. Schottky metallizations or possibly an ohmic metallization 18 partly cover the active zone 14 and are in contact with microstrips 21. In such a variant with a plurality of variable capacitors, there can be no more than a single metallization such as 18 in ohmic contact form, whilst the other metallizations are of Schottky contact form. Thus, if it is not useful for two metallizations 18 to form two diodes with the active zone 14, it is then sufficient to combine them into a single metallization. The configuration of FIG. 13 is not exhaustive, and other forms for the active zone 14 fall within the scope of the invention, provided that the Schottky metallizations form, with an active zone, a plurality of diodes, all of which have their cathodes connected to a point to which is applied a reverse control voltage.

FIG. 14 represents an application of the invention, when the semiconductor material is silicon. Into a substrate 36 are diffused or implanted firstly a type p recess 37, then two smaller type n recesses 38, 39. The polarity types of the recesses can be reversed, but it is known that metallizations adhere better to n-doped material. Two metallizations 40, 41 are respectively in contact with two recesses 38, 39, the capacitors form a p-n junction and the metallizations preferably have ohmic contact. However, in silicon, it is also possible to obtain the variable capacitance element according to the invention by means of at least two Schottky diodes, i.e. with Schottky contact metallization.

The applications of the variable capacitance element according to the invention particularly in the field of ultra-high frequency integrated circuits on GaAs or fast materials. This element is used in the construction of tunable oscillators, variable filters, phase shifters, amplifiers or switches. These integrated circuits are themselves used in radars, countermeasure systems, telecommunications and in more general terms in ultra-high frequency systems.

What is claimed is:

1. A variable capacitance element controllable by a d.c. voltage, which does not interfere with an ultra-high frequency voltage modulated by said element, and whose variable capacitance is formed by one or two diodes connected as a common cathode, and reversed biased by a control voltage applied across a resistor, wherein the said element comprises, formed in a semiinsulating material substrate:

an active zone doped at $10^{17}$ at $\cdot cm^{-3}$, having a rectangular projection whose dimensions determine the value of said resistor, a first and a second metallizations, partly covering said active zone, whereof at least one metallization forms a Schottky diode with the active zone, a third metallization, partly covering and in ohmic contact with said projection of said active zone, a control voltage being applied across said third metallization, a first microstrip in contact with the first metallization and a second microstrip in contact with the second metallization forming the access terminals to the variable capacitance element.

2. A variable capacitance element according to claim 1, wherein the first and second metallizations are Schottky metallizations and wherein the element has two Schottky diodes formed by the junction between the first and second metallizations and the active zone.

3. A variable capacitance element according to claim 1, wherein the first metallization is a Schottky metallization and a second metallization is an ohmic contact, wherein the element has a single Schottky diode, whereof the cathode receives the control voltage and whereof the anode is directly connected to the ultra-high frequency signal.

4. A variable capacitance element according to claim 1, wherein the active zone is type n doped.

5. A variable capacitance element according to claim 1, wherein the active zone is type p doped in order to increase the integration density by increasing the resistance of the doped zone.

6. A variable capacitance element according to claim 1, wherein, in order to increase the capacitance formed between the facing edges of metallizations, the metallizations have an interdigitated form and are separated by a constant space.

7. A variable capacitance element according to claim 1, wherein there are two Schottky metallizations formed by the first and second metallizations having a common point to earth and deposited in double sprial form on the active zone, which is itself connected across the resistor to a control voltage to form a transformer with a tuned circuit.

8. A variable capacitance element according to claim 2, wherein the two microstrips are at a zero d.c. voltage.

9. A variable capacitance element according to claim 3, wherein the microstrip is in contact with the Schottky metallization and is at a zero d.c. voltage and wherein the microstrip in contact with the ohmic metallization is at the d.c. control voltage.

10. A variable capacitance element according to any one of the preceding claims, wherein it is integrated into a silicon chip.

11. A variable capacitance element according to any one of claims 1-9, wherein it is integrated into a chip of material of group III-V elements.

* * * * *